United States Patent [19]

Mataré

[11] 4,032,370
[45] June 28, 1977

[54] METHOD OF FORMING AN EPITAXIAL LAYER ON A CRYSTALLINE SUBSTRATE

[75] Inventor: Herbert F. Mataré, Los Angeles, Calif.

[73] Assignee: International Audio Visual, Inc., Van Nuys, Calif.

[22] Filed: Feb. 11, 1976

[21] Appl. No.: 657,173

[52] U.S. Cl. .................... 148/171; 148/72; 148/1.5; 118/428; 252/62.3 GA

[51] Int. Cl.² ......................................... H01L 21/208

[58] Field of Search .................. 148/171, 1.5, 172; 118/428, 500; 252/62.3 GA

[56] References Cited

UNITED STATES PATENTS

| | | | |
|---|---|---|---|
| 2,813,048 | 11/1957 | Pfann | 148/1.5 X |
| 3,484,302 | 12/1969 | Maeda et al. | 148/1.5 |
| 3,520,735 | 7/1970 | Kurata | 148/1.5 |
| 3,533,856 | 10/1970 | Panish et al. | 148/1.5 |
| 3,669,763 | 6/1972 | Perusek | 148/171 |
| 3,715,245 | 2/1973 | Barnett et al. | 148/171 |
| 3,809,010 | 5/1974 | Springthorpe | 118/500 X |
| 3,956,023 | 5/1976 | Cline et al. | 148/1.5 |
| 3,967,987 | 7/1976 | Jones et al. | 148/33 X |

*Primary Examiner*—G. Ozaki
*Attorney, Agent, or Firm*—John J. Posta, Jr.

[57] ABSTRACT

The improved method of the present invention comprises contacting a clean and preferably etched selected crystalline substrate with a controlled thickness of a melt comprising a saturated solution of selected materials capable of forming semi-conductor junctions, preferably heterojunctions, with the substrate. The contacting is carried out while the resulting melt and substrate sandwich is shielded by a protective atmosphere of gas such as hydrogen and while the sandwich is subjected to a progressively lower temperature gradient maintained across the melt-wafer package.

The method and apparatus are particularly applicable to the preparation of improved light-emitting diodes by the liquid epitaxial growth technique.

20 Claims, 7 Drawing Figures

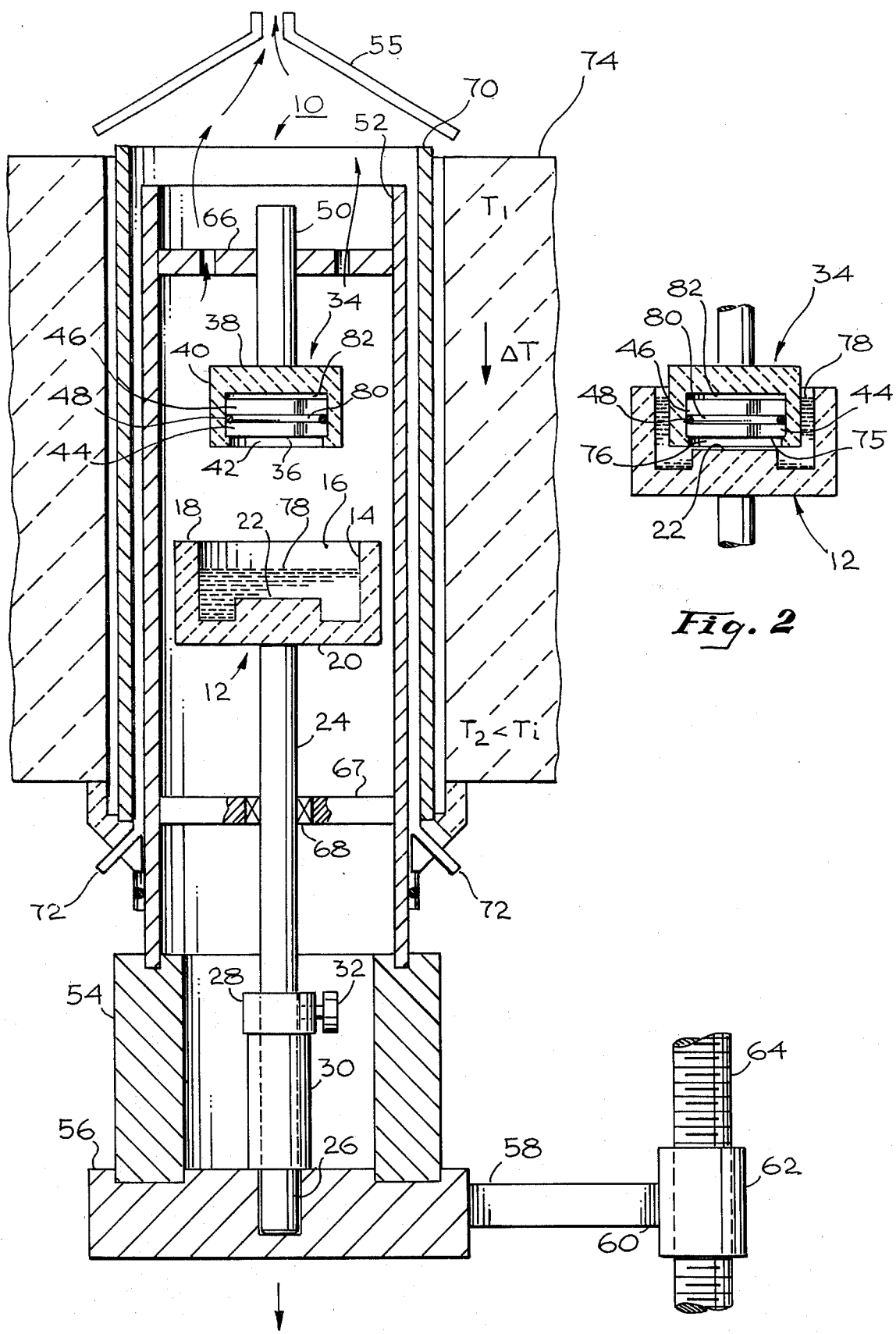

METHOD OF FORMING AN EPITAXIAL LAYER ON A CRYSTALLINE SUBSTRATE

BACKGROUND OF THE INVENTION

1. Field of the Invention

The present invention generally relates to epitaxial growth and more particularly to an improved method and apparatus for forming a desired epitaxial layer on a crystalline substrate so as to provide desired semi-conductors of high quality, particularly of the light-emitting type.

2. Prior Art

Epitaxial layers of crystalline semi-conductive material have been formed on crystalline substrates by various techniques in the preparation of semi-conductors.

One such widely used technique is known as solution growth or liquid phase epitaxy. It generally comprises exposing the surface of a crystalline substrate to a solution of semi-conductive material dissolved in a molten metallic solvent, then cooling the solution sufficiently to cause supersaturation and a portion of the dissolved semi-conductive material to precipitate on the substrate as an epitaxial layer, after which the remaining solution is removed, as by decanting, from the substrate. The epitaxial crystalline growth layer may be of a single given conductivity type or of mutually opposite types. Successive epitaxial layers of mutually opposite types can also be deposited from solutions of mixed semi-conductive materials, but this has been difficult to do in a controlled, and reproducible manner. Light-emitting devices, such as diodes, can be formed utilizing liquid phase epitaxy but numerous processing requirements must be met, depending on the particular metallurgy of the compounds of Groups III–V of the Periodic Table selected and used in the processing, their eutectic temperature ranges, diffusion constants, lattice match, etc.

Numerous attempts have been made to render the liquid phase epitaxy technique more reliable and suitable for mass producton of light-emitting devices. One prominent process is based on the lateral movement of a melt over the surface of the substrate wafer to deposit a given amount of the metallic solvent from a supersaturated solution on the wafer surface. This process has been described by a number of authors and is mostly a variant of the methods published by I. Hayashi, M. B. Panish, and P. W. Foy. (IEEE J. Quantum Electron. QE-5, 211, 1969) and M. B. Panish, I. Hayashi and S. Sumski, (Appl. Phys. Letters, Vol. 16, No. 8, April 15, 1970, pp 326.)

Such methods are based on the original Nelson U.S. Pat. No. 3,158,512 (1964), in which a wafer was brought into contact with the saturated melt by a tipping method, or its variant as set forth in Panish U.S. Pat. No. 3,557,219 (1970) and U.S. Pat. No. 3,560,276 (1971) among others. A similar method was patented by M. R. Corenz et al. in U.S. Pat. No. 3,540,941 (1970). The tipping process, however, needs a complex movement of the epitaxial heating zone or oven arrangement and was later replaced by a lateral movement of the melt and wafers in a graphite holder within the oven. such processes were patented also by H. Nelson under U.S. Pat. No. 3,565,702 (1971) and were used extensively. However, such processes do not sufficiently limit the melt or protect the wafer surface against melt-clustering and so have been found to be unsatisfactory for many commercial applications.

Newer tipping methods have been designed in which vertically arranged wafers are introduced into a melt (e.g., L. E. Stone, K. Madden, and K. W. Haisty, "Growth of thick $Ga_x Al_{1-x}$ as layers by liquid-phase epitaxy" in Journal of Electronic Materials, No. 1, 1972). The drawback in these methods is that the wafer is not subjected to the correct temperature gradient during the cooling cycle and that large size melts are needed. Further refinements of these methods were published, e.g. by J. M Blum et al. (Proceed. IEEE, Vol. 59, No. 10, October 1971). These authors improved on the original methods by transporting a small saturated melt from the saturation source directly to the substrate.

A more refined treatment was published by A. A. Berg, R. H. Saul, and C. R. Paola (Growth of GaP-wafers from thin aliquot melts: "Liquid Phase Epitaxy as a Commercial Process", J. Electrochemical Society, Vol. 120, No. 11, November 1973, pp. 1558–1563). Here, for the first time, it was clearly recognized that the deposition efficiency decreases with the melt thickness and that an aliquot melt is important to prepare the substrate surface for the actual crystallization process. It is also recognized that a larger melt prepared with the correct stoichiometric ratio and dopants, homogenized at high temperature, has to be brought in contact with the substrate. The problem with the processes working in horizontal arrangements is the lack of a temperature gradient vertical to the substrate melt sandwich. This gradient is important during the annealing period for correct and faultless outgrowth of the expitaxial layer.

Various arrangements of surface heaters in horizontal ovens have been employed in an effort to obtain proper temperature gradients and outgrowth of epitaxial layers using newer processing steps. However, they have met with little success because it is difficult to adapt the vertical gradient to the cooling cycle. (W. G. Rado, W. J. Johnson, and R. L. Crawley, J. Appl. Phys., Vol. 43, No. 6, June 1972, pp. 2763-2765.)

Accordingly, there still is a need for an improved method and apparatus to assure correct and faultless outgrowth of the epitaxial layer for the preparation of reliable superior III – V semi-conductor junctions for light-emitters in a manner which can be used commercially.

SUMMARY OF THE INVENTION

The present invention satisfies the foregoing needs. Thus, an improved method and apparatus are provided for the preparation of epitaxial layers in a simple faultless reproducible manner utilizing the liquid-phase epitaxy technique. The method and apparatus are substantially as set forth in the Abstract above. It has been discovered that in order to assure proper heat treatment of the melt while in contact with the substrate, it is necessary to properly orient the melt-substrate sandwich relative to the temperature gradient in the treating zone, so as to produce the required temperature gradient across the melt-substrate sandwich.

Specifically, the present invention improves considerably melt-back and re-growth control, as opposed to the above described older methods, and combines the necessary temperature gradients within the sandwich with the time-dependent profile of annealing to induce the correct outgrowth of epitaxial layers as well as desired dopant distributions within the epitaxial layers of III – V compounds, so as to provide high efficiency light-emitters.

The present method employs a temperature gradient zone melting technique which was described by W. G. Pfann in 1954 (U.S. Pat. No. 2,813,048). It is involved in all methods using eutectic solutions in contact with solids. The principle as noted by Pfann is that a molten zone in contact with or within a body of higher melting point material in the solid state, when placed in a temperature gradient, will move toward the region of higher temperature.

In U.S. Pat. No. 2,770,761, Pfann specifically describes N-P-N and P-N-P structures by the exclusive use of temperature gradient zone melting techniques. The actual zone melting process is described by him as follows: "A molten region is formed on the surface or in contact with a body of semi-conductor material, for example, by depositing on the semi-conductor material a layer of an alloying material which covers the melting point of the semi-conductor material and heating until a molten region is formed. Maintaining the body within a temperature gradient with the molten region at the low temperature end, which nevertheless is hot enough to keep it molten, results in the region's traveling through the body to the high temperature end of the gradient." A process to form P-N junctions in this manner is described in U.S. Pat. No. 3,089,794 by J. C. Marinace (1963) as epitaxial deposition wherein the junction is moved from the substrate-deposit interface for a selected distance.

The concentrations and diffusion profiles of the impurities in the melt cause during such heat treating a desired type of impurity to predominate in a region other than the one in which the predominance was located when a structure was fabricated. Since junctions are determined by a balance of N and P type impurities, junctions may be located in a structure as desired.

It is a specific feature of this invention to utilize the described temperature-gradient zone melting technique in conjunction with novel improvements which include:
a. optionally prewetting the substrate to assure even wetting and contacting in the contact-step, and to seal off the substrate from contaminants;
b. shielding the substrate-melt sandwich while limiting the thickness of the melt in contact with the substrate surface during heat treating; and
c. causing the sandwich to be subjected to a heat gradient in such a manner and orientation that a proper temperature gradient is maintained between the substrate and melt, with full control over such gradient to assure its uniformity for maximum results. Preferably, the main plane of the sandwich is kept perpendicular to the direction of movement of the sandwich through the oven and past each gradient in turn.

The novel apparatus of the invention, including the sandwich holder and crucible, assures that the present method can be carried out in the most uniformly expeditious manner for maximum results. Various other features of the present invention are set forth in the following detailed description and accompanying drawings.

DRAWINGS

FIG. 1 is a schematic vertical section illustrating a preferred embodiment of the improved apparatus of the invention within a heat treating oven with the holder and crucible of the apparatus separated;

FIG. 2 is a schematic vertical section of a portion of the apparatus of FIG. 1 with the holder and crucible of the apparatus approximating each other;

DETAILED DESCRIPTION

FIGS. 1 and 2

Figure 3:
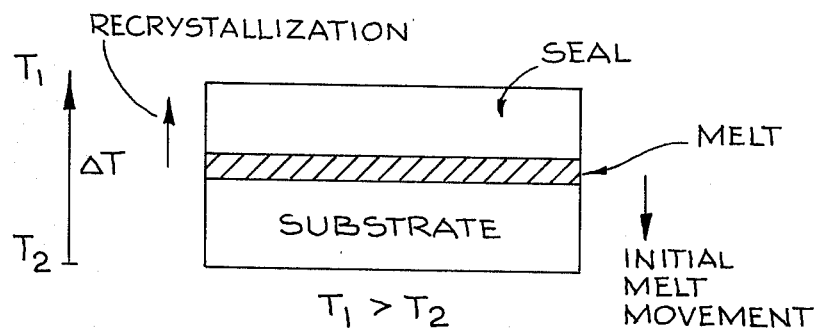
FIG. 3 is an enlarged schematic cross section of one embodiment of a melt-substrate sandwich during heat treatment thereof in accordance with the present method.

Now referring more particularly to FIG. 1 of the accompanying drawings, an apparatus 10 in accordance with the present invention is schematically shown, which apparatus comprises a receptacle or crucible 12 having a central well 14, an open top 16, and closed sidewall(s) 18, and bottom 20. Receptacle 12, may be, for example, square, rectangular, or circular in plan view but preferably is circular and contains a circular central raised platform 22 within well 14. Receptacle 12 is supported on an elongated vertical drive arm 24 secured to bottom 20. The bottom end 26 of drive arm 24 is disposed within an upraised ring clamp 28 supported on a post 30 and fitted with a retaining or set screw 32 running therethrough and into contact with end 26.

Apparatus 10 also includes a holder 34 above receptacle 12 and having an open bottom end or mouth 36 facing the open top 16 of receptacle 12 and a closed top 38 and sidewall(s) 40 so as to provide a space 42 within which to support a flat crystalline substrate wafer 44.

Preferably, holder 34 and space 42 therein are circular in plan view. As shown in FIG. 1, wafer 44 extends across the open mouth 36 of holder 34. It will be noted that a second wafer 46 is positioned parallel to and spaced above the wafer in holder 34, by means of a spacer or O-ring 48 placed between wafer 44 and wafer 46 in space 42. The top 38 of holder 36 is secured to a guide arm 50 extending vertically upwardly therefrom.

Holder 34 and receptacle 12 are vertically aligned and enclosed within and spaced inwardly of an open topped shell 52 which is supported on a base 54 secured to post 30 below a hood 55. Base 54 and post 30 are, in turn, secured to one end 56 of a cross arm 58, the opposite end 60 of which is a collar 62 threadably secured over a screw drive 64 for upward or downward movement of shell 52, holder 34, and receptacle 12, depending on the directin of turn of drive 64.

Holder 34 and receptacle 12 are maintained in vertical alignment with each other by guide arms 66 and 67 connected to and extending across shell 52. Guide arm 66 is rigidly secured to arm 50 while guide arm 67 is provided with a roller-bearing guideway 68 through which arm 24 extends. Shell 52 is disposed and spaced within an open topped outer casing 70 which is also disposed within hood 55, and which includes a gas inlet 71 and a gas outlet 72 and is secured to base 54 for movement therewith. The entire apparatus 10 is disposed within an oven 74 below hood 55, which oven has a vertical temperature gradient, as shown in FIG. 1.

With the described arrangement of apparatus 10, holder 34 and receptacle or crucible 12 can be moved into close proximity with each other, as shown in FIG. 2. Thus, while holder 34 can be made stationary, receptacle 12 can be adjusted vertically, as by ring clamp 28 and set screw 32, so that platform 22 and the nearest surface 75 of wafer 44 can approximate each other, as shown in FIG. 2, the space 76 therebetween limiting the thickness of a melt of correct composition which can be in contact with surface 75.

It will be noted that well 14 can contain a molten melt 78 which, when holder 34 and receptacle 12 are approximated as in FIG. 2, will fill space 76. The sidewall 40 and bottom end 36 of holder 34 are dimensioned to fit around platform 22, leaving enough room to permit passage of melt 78 up into holder 34. Ring 48 spaces wafer 46 far enough above wafer 44 to provide a melt thickness-limiting space 80 and wafer 46 is positioned below the upper end of space 42 to provide a melt-limiting space 82. It will be understood that spaces 76, 80, and 82 are adjustable so that melt thicknesses can also be adjustable.

THE PRESENT METHOD

In accordance with the present method as a first, optional but desirable step, the surface of a substrate such as surface 75 of wafer 44, which is to be contacted with a molten melt in the heat treating step of the present method is first prewetted with material selected from the group consisting of (a) the melt to be used in heat treating step, or (b) a major constituent thereof, preferably the solvent thereof. Thus, a thin layer of, for example, molten gallium of, for example, about 0.5 – 1.5 mm in thickness or the like, can be dipped brushed, wiped, sputtered, or otherwise applied to one or both extended surfaces of a thin flat crystalline wafer of gallium phosphide, gallium arsenide, or the like.

Alternatively, the melt to be used in the heat treating step can be employed as the prewetting agent. For example, a melt comprising about 50 gm. of Ga, about 0.6 gm of Al, and about 0.6 gm. of Zn can be applied in a molten state to the desired surfaces of the wafer to achieve the same results. It will be understood that the surface to be prewetted preferably has been cleaned and most preferably also has been etched.

The substrate wafer is then contacted and wetted with the desired molten melt. The melt is a saturated solution of selected constituents in a molten metallic solvent. For example, gallium or indium or the like can be employed as the solvent metal or main constituent with the other or minor constituents varying, depending on the heteroepitaxial layer desired, the substrate and the properties desired in the finished semi-conductor. As an example, for a gallium phosphine substrate, indium can be used in about 21 gm. amount, with gallium phosphide in about 0.5 gm. amount and tellurium in about 0.100 gm. amount, the molten indium containing a saturated solution of the minor constituents at the preparation and operating temperature of the melt, about 950° C. The minor constituents are in such concentration that this melt is kept saturated at the correct operating temperature, for example, about 950° C. in the contact and heat treating zone, preferably well 14 of crucible 12.

From this point on, reference will be made to the present method in conjunction with the present apparatus and its manner of operation. However, it will be understood that other apparatus could be used if desired within which to carry out one or more embodiments of the present method.

The melt 78 in well 14 is brought into contact with wafer 44 (and also preferably wafer 46) in holder 34 by moving crucible 12 (which may be graphite or the like) up in shell 52 until the position of crucible 12 and holder 34 as shown in FIG. 2 is reached, after which the crucible is clamped into this position via clamp 28 and set screw 32. This can occur shortly before the melt has reached saturation or as it reaches saturation, e.g. at about 950° C or 900°– 1000° C. In this position holder 34 is immersed in well 14 and wafer 44 is spaced from platform 22 a melt limiting thickness represented by space 76, which becomes filled with molten melt 78 as do melt limiting spaces 80 and 82, so that both extended surfaces of wafers 44 and 46 are contacted and wetted with the molten melt 78.

It will be noted that wafers 44 and 46 are totally enclosed and sealed by melt 78 and holder 34 and that, moreover, a protective atmosphere of hydrogen gas floods casing 70 and shell 52 to assure that no untoward reactions (such as oxidation) take place before, during, or after the heat treating in oven 74. Casing 70 and shell 52 may be quartz tubes or the like.

The melt limiting spaces 76, 80 and 82 are controlled, preferably to provide an average melt thickness adjacent each extended surface of the wafers of about 0.2 – 2.0 mm.

This has been found to be necessary to assure optimal characteristics of the epitaxial layer in the product.

The resulting sandwich is then moved in the heat treating step of the present method from a starting point near the center of oven 74 down through a series of zones (shown in FIG. 1) of progressively decreasing temperature in oven 74, by means of cross arm 58 and worm drive 64. It will be noted that in order to maximize the desired epitaxial layer formation, it is also necessary to assure that the wafers 44 and 46 are oriented with their main planes about perpendicular to the direction of movement of the sandwich down through oven 74. This is to assure proper heat treatment of all parts of the sandwich at each point in time. A controlled temperature gradient is maintained in the sandwich, with the wafers 44 and 46 always uniformly lower in temperature than the melt in contact therewith.

The maximum temperature of the oven is at the starting point of the descent of the sandwich and will vary, but for purposes of illustraton may be, for example, about 900°– 1000° C., while the minimum oven temperature at the lower end of the oven may be, for example, about 500° C. For a single wafer and melt sandwich thickness, for example, about 1.4 mm., this means that there may be a vertical gradient in such sandwich of from about 0.5° to 5° C.

Figure 4:
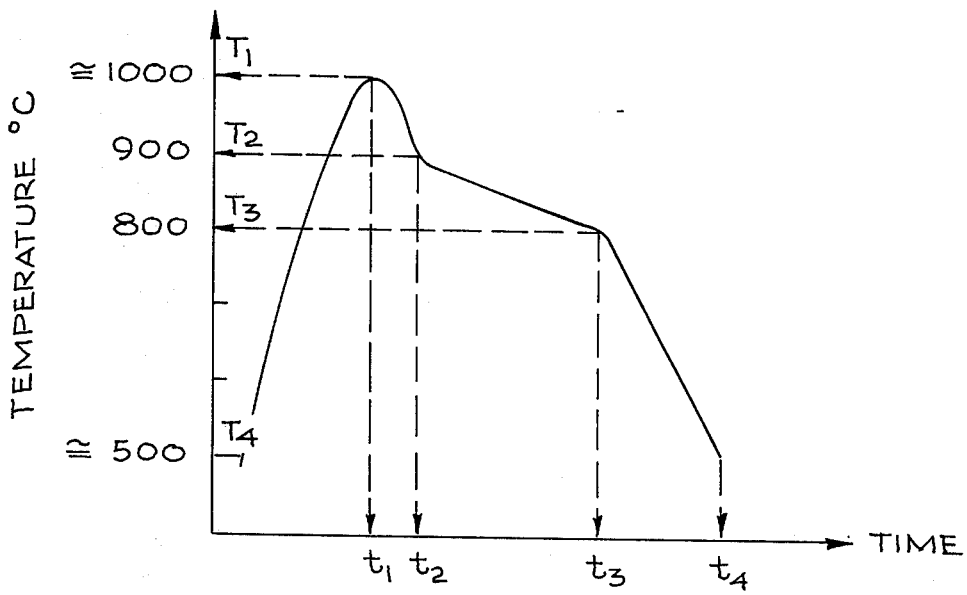
FIG. 4 is a schematic graph illustrating the relationship of time and temperature in the heating step of the present method.

The speed with which the sandwich passes down through oven 74 preferably varies, depending on the stage of the heat treating. Thus, referring to FIG. 4 of the accompanying drawings, a typical curve depicting the temperature-time relationship during heat treating of the sandwich is schematically shown. In this instance, there is a rapid rise of the temperature of the oven 74 to the starting point temperature, about 1000° C at $t_1$. Then as the sandwich passes down in oven 74, there is a steep and rapid decrease in treating temperature to about 900° C, during that short time interval $t_1$–$t_2$, after which the temperature declines less rapidly to about 800° C in the longer time interval $t_2$–$t_3$, and then more rapidly in the time interval $t_3$–$t_4$ to the end point, about 500° C. The time-temperature relationship throughout $t_1$–$t_4$ and 1000° –500° C range can vary from about 0.1° C to about 10° C/minute, depending on the particular stage of the heat treating being carried out in oven 74.

FIG. 3 shows schematically the direction of melt movement during the liquid phase epitaxial depositon caused by the described heat treating. Careful control of parameters must be maintained to achieve desired results. Thus, during the described heat treatment the relative concentration of constituents in the melt may vary. It has been found that the concentration gradient of constituents in the melt decreased for thin melts, as opposed to thick melts. The diffusion coefficient D of the ternary element in the melt (such as Al in Ga, or P in In) is much smaller, often four orders of magnitude smaller, than the thermal diffusivity of the melt solvent atoms, for example, Ga or In. The concentration of constituents at a given point measured from the substrate is dependent on melt thickness, on D, and on time and temperature. Taking these factors into consideration, it has been determined that there is a minimum temperature gradient perpendicular to the substrate required and a required cooling rate in ° C /min. in order to avoid constitutional supercooling and thus melt inhomogenizaton during epitaxial layer deposition. The temperature differential ΔT for disposition is also important.

Typical values for GaP in Ga are set forth in the Table below:

TABLE

| Melt Thickness (mm) W | ° C T | Cooling Rate (° C/min.) | dT/dx ° C/cm |
|---|---|---|---|
| 0.5 | 108 | 3.6 | 6.0 |
| 1 | 40 | 1.3 | 4.5 |
| 2 | 18 | 0.6 | 4.1 |
| 4 | 8 | 0.3 | 2.0 |
| 12 | 3 | 0.1 | 1.1 |

Melt depletion is highest for a small melt thickness and decreases as the melt thickness increases. Usually the cooling rate of the sandwich in oven 74 can be higher for thin melts than for thick melts but the gradient $dT/dx$ also has to be higher. This is achieved by the arrangement of the main plane of the sandwich so that it is perpendicular to the length of the oven 74 and direction of movement of the sandwich through oven 74. Accordingly, the sandwich orientation afforded by the present apparatus 10 and the present method is important.

As the heat treating continues, the temperatures of the various parts of the sandwich decline until the heat treating is completed, deposition of the desired epitaxial layer, usually heteroepitaxial, has occurred and controlled migration of minor constituents in the substrate has produced the desired results. The sandwich is then separated from the melt, as by decanting the melt, etc. and the semi-conductor product is recovered. The heterojunctions preferably produced by the present method are usually those in which a desired crystalline ternary compound is formed on the semi-conductor substrate by growth from the melt, which ternary compound has a wider forbidden gap than the base substrate such as gallium phosphide or gallium arsenide, etc. There is usually also an intermediate softly doped region between epilayer and substrate which is graded and diffusion compensated and serves mostly as the region of recombination of electron-hole pairs in the semi-conductor. The substrate may be chosen in accordance with the top-layer structure desired for a particular optical transparency.

Figure 5A:
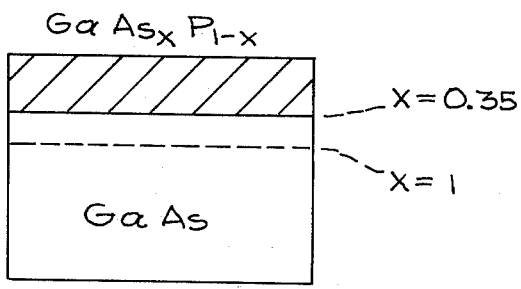
FIGS. 5 (a, b and c) are a schematic depiction of three epitaxial layers as produced on various substrates by the present method.
Figure 5B:
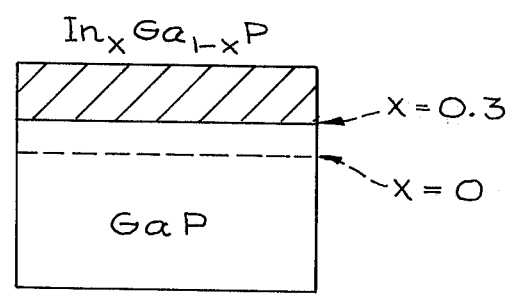
Figure 5C:
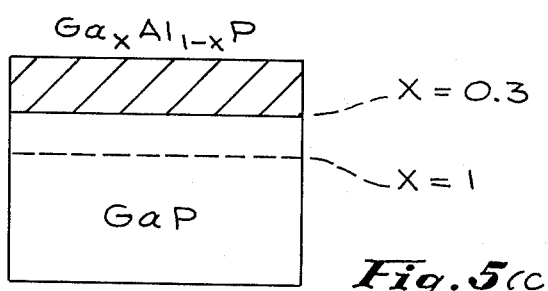

Examples of epitaxial layers produced by the present method are set forth schematically in FIG. 5. Thus, in 5 (a), a GaAs substrate is provided with a ternary layer of $GaAs_xP_{1-x}$ where $x=0.35$, and a softly doped intermediate graded region where x decreases to 1, i.e. to the GaAs substrate.

In FIG. 5(b), a GaP substrate has a ternary compound layer of $In_xGa_{1-x}P$ produced thereon where $x=0.3$, while a softly doped intermediate region where x decreases to about 0 is disposed therebetween.

In FIG. 5 (c), a ternary compound layer $Ga_xAl_{1-x}P$ where $x = 0.3$ is provided on a GaP substrate with an interposed softly doped region where x gradually increases to 1.

A fourth example (not shown) is $Ga_xAl_{1-x}As$ on GaAs, with a reasonable lattice match. In each instance, a light-emitting semi-conductor of improved properties is provided.

GaP has a wider gap than $In_xGa_{1-x}P$ so that such a semi-conductive device would have to be reversed in optional mode from those of $Ga_xAl_{1-x}As$ or $GaAs_xP_{1-x}$ or GaAs where the ternary layer has a wider gap than the substrate. With $Ga_{0.7}Al_{0.3}P$, GaP can form a top transparent junction radiating the yellow spectral region.

As other non-limiting examples of semi-conductors produced by the present method, the ternary compound layer $In_xGa_{1-x}P$ can be produced on InP, and the ternary compound layer $In_xGa_{1-x}P$ can be produced on Ga(AsP) or GaAs.

Various modifications, changes, alterations, and additions can be made in the present method, its step and parameters and in the present apparatus and its components. All such modifications, changes, alterations and additions as are written the scope of the appended claims form part of the present invention.

What is claimed is:

1. An improved method of forming an epitaxial layer of crystalline semi-conductive material on a crystalline substrate, said method comprising:
   a. contacting and wetting a clean selected crystalline substrate with a controlled thickness of selected molten melt to form a sandwich, said melt comprising a saturated solution of selected semi-conductive materials capable of forming desired semi-conductive junctions with said substrate, said contacting and wetting being carried out while shielding said sandwich from contamination;
   b. maintaining said shielding while subjecting said sandwich to heat treatment comprising controlled progressive lowering of temperature of said sandwich while maintaining said melt molten and said substrate cooler than said melt until depositon of the desired epitaxial layer on said substrate is effected; and
   c. recovering the semi-conductive product.

2. The improved method of claim 1 wherein said product comprises a light-emitting diode wherein said epitaxial layer is a heteroepitaxial layer and wherein said shielding includes a protective enclosure filled with an inert gas and enclosing said sandwich.

3. The improved method of claim 2 wherein said substrate comprises GaAs and wherein said heteroepitaxial layer comprises $Ga_xAl_{1-x}As$.

4. The improved method of claim 2 wherein said substrate comprises GaAs and wherein said heteroepitaxial layer comprises $GaAs_xP_{1-x}$.

5. The improved method of claim 2 wherein said substrate comprises GaP and said heteroepitaxial layer comprises $In_xGa_{1-x}P$.

6. The improved method of claim 2 wherein said substrate comprises GaP and said heteroepitaxial layer comprises $Ga_xAl_{1-x}P$.

7. The improved method of claim 2 wherein said substrate comprises GaAs and said heteroepitaxial layer comprises $In_xGa_{1-x}P$.

8. The improved method of claim 1 wherein said epitaxial layer is heteroepitaxial, and wherein said progressive temperature lowering is at a rate sufficient to prevent melt inhomogenization and is effected by passing said sandwich through an elongated treating zone having a plurality of successive heating sub-zones forming a temperature gradient from one end of said zone to the opposite end thereof.

9. The improved method of claim 8 wherein said substrate comprises a relatively thin wafer, wherein said melt is disposed generally parallel to the main axis of said wafer and wherein said sandwich is passed through said zone progressively from the hotter end to the cooler end of said zone with said main axis generally perpendicular to the main axis of said zone and the direction of said passage through said zone whereby improved formation of said layer is effected.

10. The improved method of claim 9 wherein said sandwich is passed through said zone at a heat change rate of about 0.1°– 10° C/minute.

11. The improved method of claim 10 wherein the temperature gradient within said sandwich is about 1°– 6° C/cm (thickness of said sandwich perpendicular to said main axis).

12. The improved method of claim 10 wherein said melt has a thickness of about 0.2 – 2 mm. in said sandwich.

13. The improved method of claim 12 wherein a spaced plurality of said sandwiches are simultaneously passed through said zone.

14. The improved method of claim 1 wherein said substrate is covered and wetted by said melt on opposite sides of extended surface area and wherein the melt on each said side has said thickness of about 0.2 – 2 mm.

15. The improved method of claim 1 wherein said sandwich is disposed in a holder fitted within a crucible to form a tool which limits said thickness of said melt, protects said sandwich and progressively moves said sandwich through said zone.

16. The improved method of claim 15 wherein a plurality of said sandwiches are supported in spaced relation within said tool during said passage through said zone.

17. The improved method of claim 1 wherein said epitaxial layer is heteroepitaxial, wherein said substrate is prewetted before treating it with said melt in said zone, and wherein said prewetting is effected by contacting the surface of said substrate with material selected from the group consisting of a major component of said melt and said melt, at a temperature lower than that of said zone.

18. The improved method of claim 17 wherein said substrate surface is prewetted with said major component which comprises the solvent of said melt.

19. The improved method of claim 17 wherein said substrate surface is prewetted with said melt.

20. The improved method of claim 17 wherein said product is a light-emitting diode, wherein said sandwich is disposed in a holder fitted within a crucible to form a tool which is in turn shielded by hydrogen and disposed for movement along the length of an elongated oven having a plurality of progressively cooler heating zones from one end to the other, wherein the dimensions of said holder limit the thickness of said melt on said substrate to about 0.2 – 2 mm. per substrate surface, wherein said substrate is a flat thin wafer with its main axis perpendicular to the direction of movement of said tool from the hotter to the cooler end of said oven during said treating, and wherein the rate of movement of said sandwich is such as to produce a heat change rate in said sandwich of about 0.1°– 10° C/minute and a temperature gradient in said sandwich of about 1°– 6° C / cm. sandwich thickness perpendicular to said main axis, so as to produce an essentially perfect epitaxial liquid layer regrowth with essentially perfect impurity distribution, due to melt limitation, for desired heterojunctions.

* * * * *